United States Patent
Gy et al.

(10) Patent No.: US 12,366,623 B2
(45) Date of Patent: Jul. 22, 2025

(54) METHOD FOR CARRYING OUT POST-PROCESSING ON SAMPLES OF A WASAB1 ACQUISITION SEQUENCE

(71) Applicant: OLEA MEDICAL, La Ciotat (FR)

(72) Inventors: Benoît Gy, La Ciotat (FR); Christos Papageorgakis, La Ciotat (FR); Stefano Casagranda, Bussero (IT); Timothé Boutelier, Ceyreste (FR)

(73) Assignee: OLEA MEDICAL, La Ciotat (FR)

( * ) Notice: Subject to any disclaimer, the term of this patent is extended or adjusted under 35 U.S.C. 154(b) by 282 days.

(21) Appl. No.: 17/999,615

(22) PCT Filed: Oct. 13, 2021

(86) PCT No.: PCT/FR2021/051785
§ 371 (c)(1),
(2) Date: Nov. 22, 2022

(87) PCT Pub. No.: WO2022/090644
PCT Pub. Date: May 5, 2022

(65) Prior Publication Data
US 2023/0288513 A1    Sep. 14, 2023

(30) Foreign Application Priority Data
Oct. 29, 2020   (FR) .......................... 2011110

(51) Int. Cl.
*G01R 33/56* (2006.01)
*G01R 33/24* (2006.01)
(Continued)

(52) U.S. Cl.
CPC ....... *G01R 33/5608* (2013.01); *G01R 33/246* (2013.01); *G01R 33/50* (2013.01);
(Continued)

(58) Field of Classification Search
CPC .. G01R 33/5608; G01R 33/246; G01R 33/50; G01R 33/56563; G06T 7/0012; G06T 7/10088
(Continued)

(56) References Cited

U.S. PATENT DOCUMENTS

| 12,019,134 B2* | 6/2024 | Katscher ............ G01R 33/5607 |
| 2016/0187438 A1* | 6/2016 | Gui .................... G01R 33/5659 |
| | | 324/309 |

(Continued)

FOREIGN PATENT DOCUMENTS

EP            3617733 A1      3/2020

OTHER PUBLICATIONS

International Search Report (PCT/ISA/210) with English translation and Written Opinion (PCT/ISA/237) mailed on Feb. 11, 2022, by the European Patent Office as the International Searching Authority for International Application No. PCT/FR2021/051785.
(Continued)

*Primary Examiner* — Gabriel I Garcia
(74) *Attorney, Agent, or Firm* — BUCHANAN, INGERSOLL & ROONEY PC

(57) ABSTRACT

The invention relates to a method for carrying out post-processing on a first set of samples measuring the magnitude of a WASAB1 signal delivered by a magnetic-resonance medical-imaging apparatus. Such a method comprises a step of detecting the samples of a first set Z, for which samples the respective polarities of the values of the measured signal are known, and of constructing a second set Y of "polarised" samples. Such a method further comprises a step of fitting a determined model to said second set Y, the two parameters of the determined model describing the static magnetic field B0 and excitation magnetic field B1 of the magnetic-resonance medical-imaging apparatus, respectively, and of
(Continued)

producing an estimation of the parameters B0 and B1 of the model. Such a method relates to any magnetic-resonance-imaging application in which a correction for inhomogeneities in the fields B0 and B1 is required.

10 Claims, 6 Drawing Sheets

(51) Int. Cl.
  *G01R 33/50* (2006.01)
  *G01R 33/565* (2006.01)
  *G06T 7/00* (2017.01)
(52) U.S. Cl.
  CPC ...... *G01R 33/56563* (2013.01); *G06T 7/0012* (2013.01); *G06T 2207/10088* (2013.01)
(58) Field of Classification Search
  USPC .......................................................... 382/131
  See application file for complete search history.

(56) References Cited

U.S. PATENT DOCUMENTS

| | | | |
|---|---|---|---|
| 2018/0011158 A1* | 1/2018 | Katscher | G01R 33/4824 |
| 2022/0342021 A1* | 10/2022 | Sun | A61B 5/7203 |
| 2022/0392035 A1* | 12/2022 | Gao | G06T 5/20 |

OTHER PUBLICATIONS

Schuenke et al., "Simultaneous mapping of water shift and B1 (WASAB1) application to field-inhomogeneity correction of CEST MRI data", Magnetic Resonance in Medicine, Feb. 2017, pp. 571-580.

\* cited by examiner

METHOD FOR CARRYING OUT POST-PROCESSING ON SAMPLES OF A WASAB1 ACQUISITION SEQUENCE

The invention relates to a method for carrying out post-processing on a WASAB1 acquisition sequence, such as disclosed in the document "Simultaneous mapping of water shift and B1 (WASAB1)—application to field-inhomogeneity correction of CEST MRI data. Magnetic resonance in medicine. 2017 February—Schuenke P, Windschuh J, Roeloffs V, Ladd M E, Bachert P, Zaiss M", hereinafter denoted by "Publication". Such a WASAB1 sequence makes it possible to simultaneously map the static magnetic field B0 and the excitation magnetic field B1 of a magnetic resonance imaging device, better known by the acronym MRI. Of course, such a post-processing method has applications within the framework of CEST (Chemical Exchange Saturation Transfer) imaging, for which the WASAB1 sequence was invented, but more generally in any magnetic resonance imaging application for which a correction of inhomogeneities of said B0 and B1 fields is required. The application of said post-processing method according to the invention, when it is applied to CEST imaging, makes it possible to use this technique in the clinical field, and thus to quantify a biomarker linked with a chemical species of interest of a human or animal organ in order, in fine, to characterize different lesions with altered metabolic properties such as tumours, ischemic tissues or multiple sclerosis.

Figure 1:
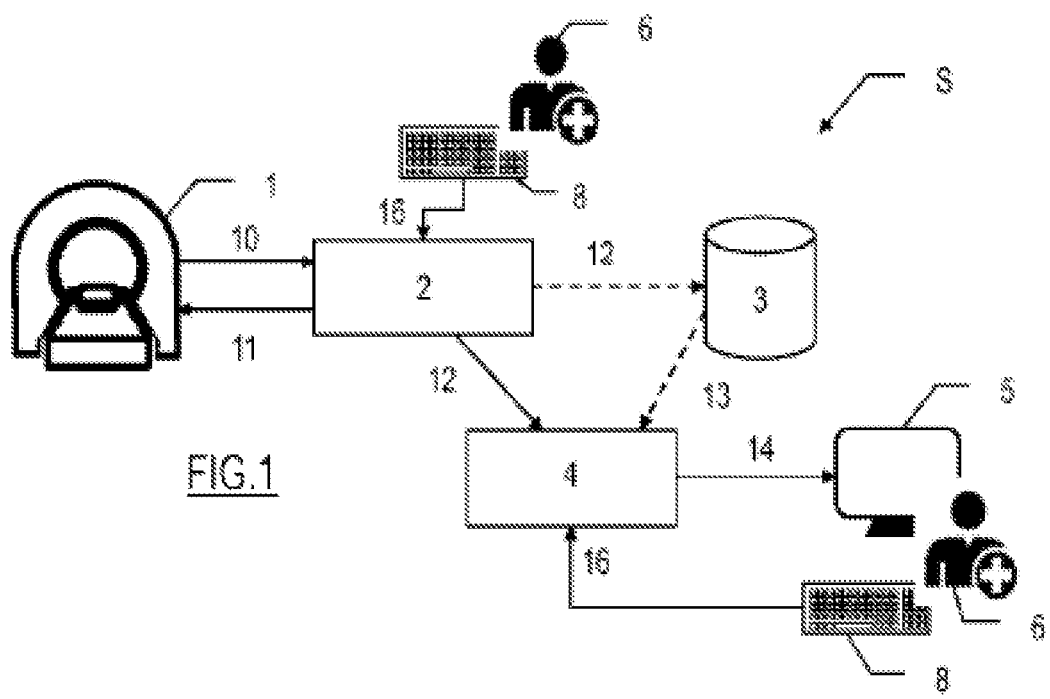
Figure 2:
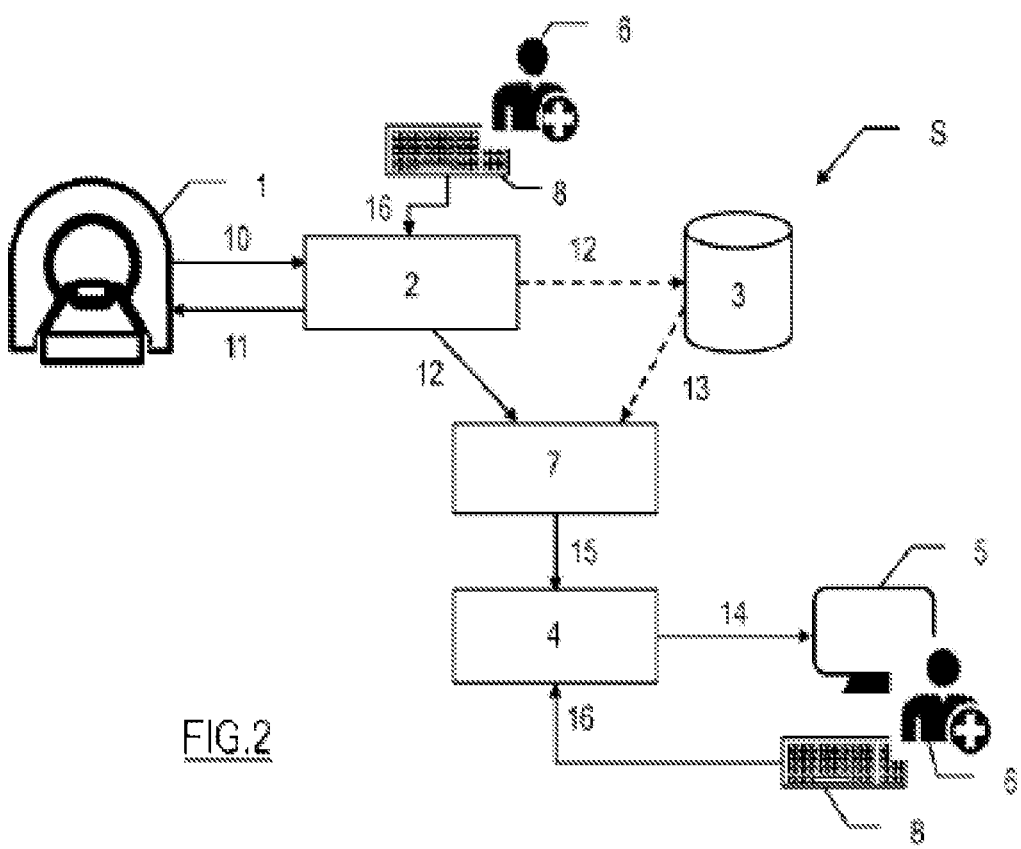

Magnetic resonance imaging is based on an analysis of the response of the proton of a water molecule when it is excited in a magnetic field. This response depends on the environment of such a proton, and thus makes it possible to differentiate between different types of tissue. A nuclear magnetic resonance imaging device 1, as illustrated by way of non-limitative example by FIGS. 1 and 2, is generally used. This delivers a plurality of sequences of digital images 12 of one or more parts of the body of a patient, by way of non-limitative examples the brain, the heart, the lungs. For this purpose, said device applies a combination of high-frequency electromagnetic waves to the part of the body under consideration and measures the signal re-emitted by certain atoms, such as hydrogen by way of non-limitative example for nuclear magnetic resonance imaging. The device thus makes it possible to determine the magnetic properties and, consequently, the chemical composition of the biological tissues and therefore their nature, in each elementary volume, which is commonly called a voxel, of the imaged volume. The nuclear magnetic resonance imaging device 1 is controlled with the aid of a console 2. A user 6, for example an operator, practitioner or researcher, can thus choose commands 11 for controlling the device 1, from parameters or instructions 16 entered via a human-machine input interface 8 of the analysis system. Such a human-machine interface 8 can consist for example of a computer keyboard, a pointing device, a touchscreen, a microphone or, more generally, any interface arranged to translate a gesture or an instruction given by a human 6 into control or configuration data. From information 10 produced by said device 1, a plurality of sequences of digital images 12 of a part of a human or animal body are obtained. Such information 10 or images 12 will also be called "experimental data".

The sequences of images 12 can optionally be stored within a server 3, i.e. a computer equipped with its own storage means, and can make up a medical file 13 of a patient. Such a file 13 can comprise images of different types, such as functional images highlighting the activity of the tissues or anatomical images showing the properties of the tissues. The sequences of images 12 or, more generally, the experimental data are analysed by a processing unit 4 arranged for this purpose. Such a processing unit 4 can, for example, consist of one or more microprocessors or microcontrollers implementing appropriate application program instructions loaded onto storage means, such as a non-volatile memory, of said imaging analysis system. Said processing unit 4 includes means for communicating with the outside world in order to collect the images. Said communication means make it possible moreover for the processing unit 4 to deliver, in fine, a depiction, for example graphic and/or sound, of an estimation or quantification of a biomarker worked out by said processing unit 4 from the experimental data 10 and/or 12 obtained by magnetic resonance imaging, to a user 6 of the imaging analysis system through a human-machine output interface 5. Throughout the document, by "human-machine output interface" is meant any device, used on its own or in combination, making it possible to output or deliver a graphic, haptic or sound representation, or one which is more generally perceptible to humans, of a reconstructed physiological signal, in this particular case a biomarker, to a user 6 of a magnetic resonance imaging analysis system. Such a human-machine output interface 5 can consist, non-exhaustively, of one or more screens, loudspeakers or other alternative suitable means. Said user 6 of the analysis system can thus confirm or invalidate a diagnosis, decide on a therapeutic action judged to be appropriate, go into more depth on research work, refine parameters for fine-tuning measurement equipment, etc. Optionally, this user 6 can also configure the operation of the processing unit 4 or the human-machine output interface 5, by means of operating and/or acquisition parameters 16. For example, it is thus possible to define display thresholds or to choose the estimated or quantified biomarkers, indicators or parameters for which it is desired to have a representation. For this purpose, the user uses the previously mentioned human-machine input interface 8 or a second input interface provided for this. Advantageously, the human-machine input 8 and output 5 interfaces can constitute only one and the same physical entity. Said human-machine input 8 and output 5 interfaces of the imaging analysis system can also be integrated in the acquisition console 2. There is a variant, described in connection with FIG. 2, for which an imaging system, such as described previously, moreover includes a pre-processing unit 7 for analysing the sequences of images 12, for deducing therefrom experimental signals 15 and for delivering these latter to the processing unit 4, which is thus relieved of this task.

Figure 3:
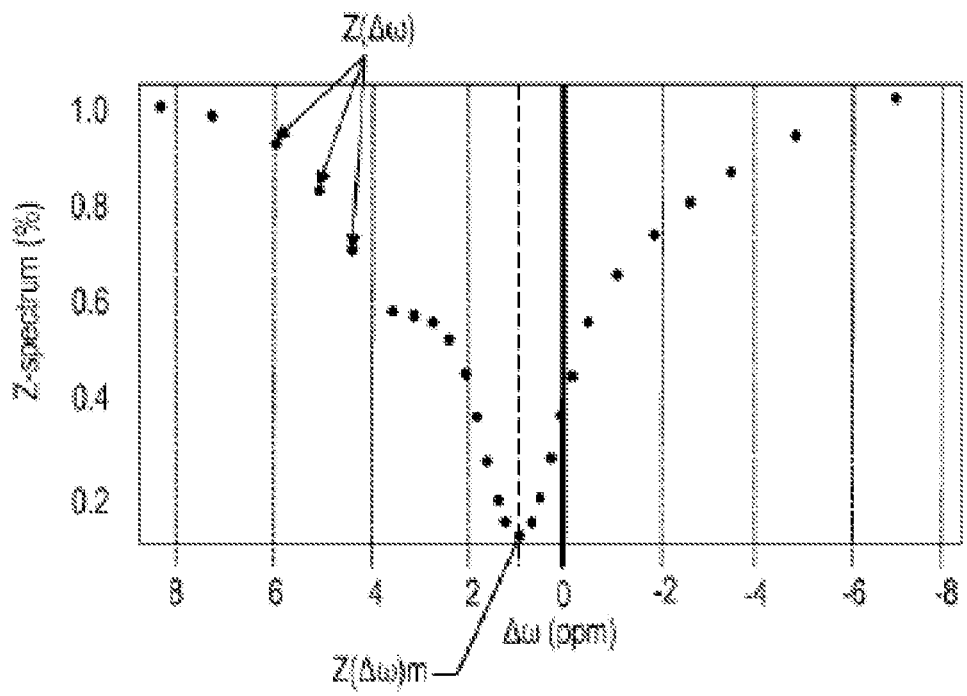

Of the techniques or methods based on magnetic resonance imaging, chemical exchange saturation transfer or CEST imaging is distinguished. Such a technique consists of applying a radiofrequency pulse according to different determined resonant frequencies w, such that chemical species of interest reach a state of saturation. Said determined resonant frequencies w are in fact respectively associated with different chemical species of interest, such as, non-limitatively, the amide group (—NH), the amine group (—NH2) or the hydroxyl group (—OH). Their labile hydrogen protons excited in this way are exchanged with non-excited hydrogen protons of water. Such an application of a radiofrequency pulse, at a determined resonant frequency ω other than that ω0 associated with water, repeated continually for a determined duration, for example a few seconds, leads to an accumulation of water saturation of a chemical species of interest. A concentration of the latter can be measured indirectly by the decrease in the signal of the water, the phenomenon called the "CEST effect", which is analysed in the form of a Z-spectrum. Such a decrease can be easily detected by rapid magnetic resonance imaging acquisition sequences such as "single-shot echo-planar imaging". FIG. 3 shows an example of a Z-spectrum in the form of a set of samples $Z(\Delta\omega)$ (or "data set") according to relative frequency offsets $\Delta\omega$ with respect to the frequency of water, such offsets $\Delta\omega$ being expressed in ppm. When the samples $Z(\Delta\omega)$ are ordered according to decreasing $\Delta\omega$, as indicated in FIG. 3, said Z-spectrum can be described in the form of a discrete signal describing measurements, advantageously standardized by a measured signal without saturation by radiofrequency and expressed in percentages, of the magnitude of an experimental signal delivered by a measurement device 1 for an elementary volume of an organ. According to FIG. 3, this set of samples, when these latter are ordered according to decreasing frequency offsets $\Delta\omega$, constitutes a discrete Z signal substantially describing a 'V', the minimum $Z(\Delta\omega)$m of which is associated with the frequency offset $\Delta\omega=1$ ppm. Logically, said minimum $Z(\Delta\omega)$m should be associated with a frequency offset $\Delta\omega$ of zero if said device was perfectly fine-tuned and/or the static magnetic field was homogeneous.

The CEST technique improves the detection of certain metabolites of the human body, the concentration of which is insufficient to be detected by traditional magnetic resonance imaging sequences. This CEST technique thus makes it possible to obtain invaluable information for a practitioner seeking to establish a diagnosis and to make a therapeutic decision in the treatment of pathologies. In the clinical field, however, such biomarkers have to be produced rapidly and accurately. However, the implementation of the CEST technique requires, according to the state of the art, a power and/or calculation times which are incompatible with the requirements imposed by the clinical field in particular.

Numerous effects interact with the saturation transfer during a continuous application of radiofrequency pulses, such as direct water saturation (DS) or else magnetization transfer (MT) contrast. Other phenomena combine with said effects and are inherent in the implementation of a magnetic resonance imaging technique, such as inhomogeneities of magnetic fields. In fact, CEST contrast is based on the chemical exchange between the labile protons and water. MT contrast originates from the magnetization exchange between the protons of water and the protons in a solid or semi-solid environment. Corrections are therefore necessary in order to obtain a reliable CEST signal. Furthermore, although theoretically, in order to extract a signal characterizing the concentration of a molecule of interest, a water saturation only requires a few spectral localizations, for example, mainly around the resonant frequency of water, in practice such an extraction is complex owing to the presence of inhomogeneities of the static magnetic field B0 of the magnetic resonance imaging devices. These inhomogeneities are partially caused by the tissue properties of the patient and involve an offset of the spectral samples acquired, as indicated in FIG. 3.

Figure 4:
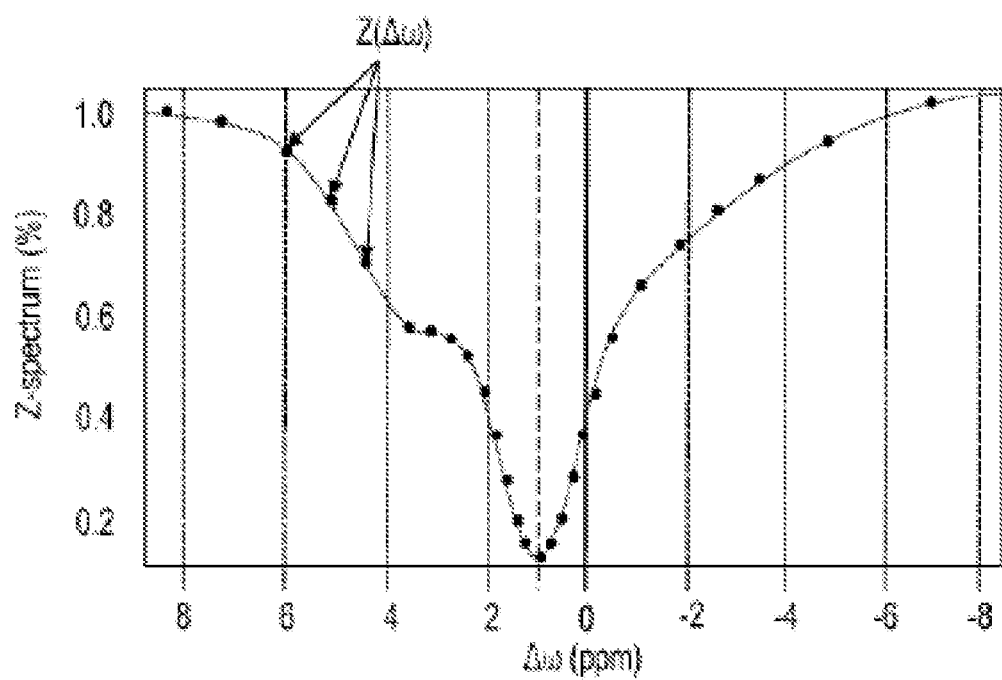
Figure 5:
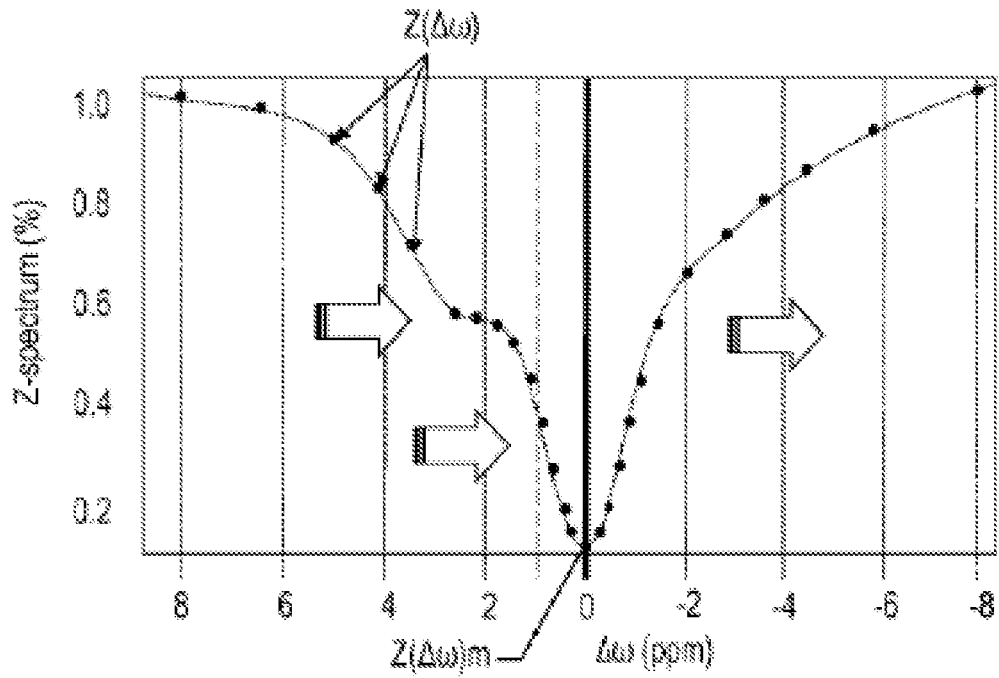

In order to overcome this problem, a dense sampling is carried out around the resonant frequency of water. The acquired measurements are then standardized by a measured signal without saturation by radiofrequency. With a suitable mathematical interpolation, as indicated in FIG. 4, the Z-spectrum can be obtained, voxel by voxel, for a range of frequency offsets of interest. The samples of the latter, after being ordered according to decreasing frequency offsets $\Delta\omega$, describe a discrete signal with a substantially "V" shape or curve. Said Z-spectrum is then "recentred" in order that its minimum $Z(\Delta\omega)$m corresponds to the frequency of water, as indicated in FIG. 5. The Z-spectrum can thus be described in a relative form, the frequency of water being equal to a frequency offset $\Delta\omega$ of zero, the frequencies w being expressed in ppm in the form of a relative frequency offset $\Delta\omega$, which is positive or negative in relation to the frequency of water. Such a relative frequency offset is generally expressed in ppm. A correction of the parameter B0, as illustrated in FIG. 5, can thus be applied to a plurality of voxels or elementary volumes. Maps called intrinsic maps MB0, i.e. raster images, can be calculated then displayed, using the offset position of the minimum $Z(\Delta\omega)$m of the Z-spectrum for a set of elementary volumes.

Figure 6A:
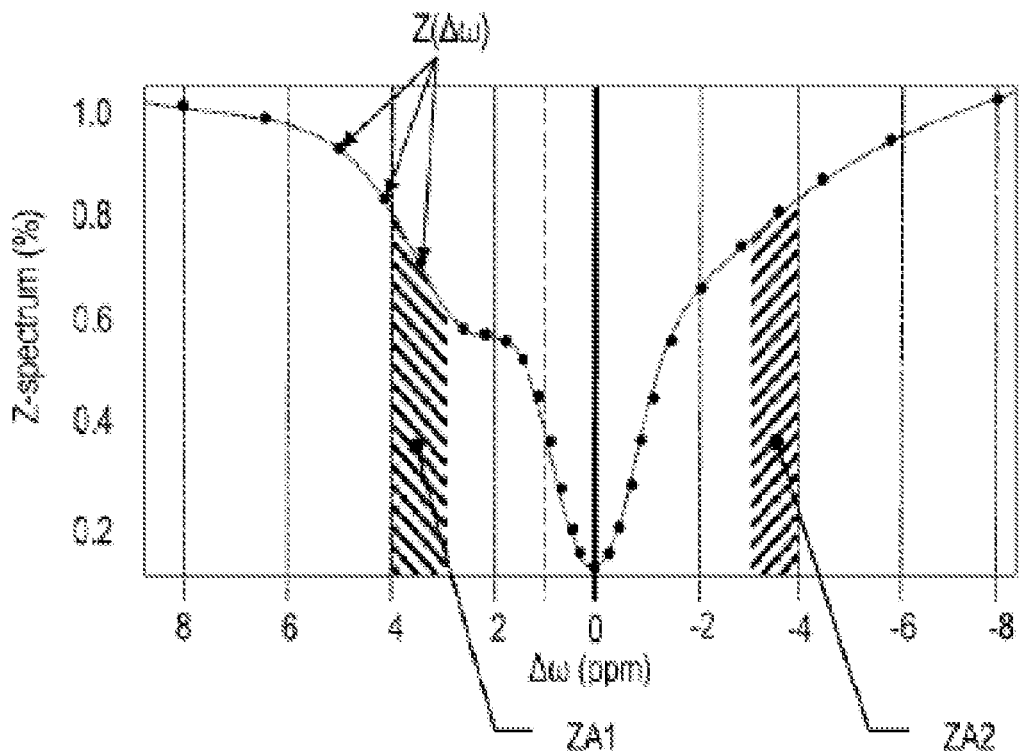

FIG. 6A illustrates the determination of a first non-limitative example of a biomarker produced from a Z-spectrum, as described previously in connection with FIGS. 3 to 5. Such a biomarker can correspond to the difference between a first area ZA1, which is generally called "Label", under the interpolated curve of the Z-spectrum from the samples $Z(\Delta\omega)$ and a second area ZA2, which is generally called "Reference", under said curve, for respective ranges of frequency offsets $\Delta\omega$ symmetrical in relation to the frequency offset of zero. In this particular case, in the example of FIG. 6A, the area ZA1 is associated with the frequency offsets comprised between +3 ppm and +4 ppm and the area ZA2 is associated with the frequency offsets comprised between −3 ppm and −4 ppm. Such a choice of ranges is usually associated with amides. In fact, the resonant frequency of amides generally corresponds on average to the frequency offset $\Delta\omega=3.5$ ppm. As a variant, if the interest is in amines the resonant frequency of which corresponds generally on average to the frequency offset $\Delta\omega=2$ ppm, said ranges will be able to be chosen as being comprised respectively from 1.5 ppm to 2.5 ppm for the area ZA1 and from −1.5 ppm to −2.5 ppm for the area ZA2. Parametric maps associated with this biomarker can be put together and optionally displayed in order to describe said biomarker for a plurality of elementary volumes of interest.

Figure 6B:
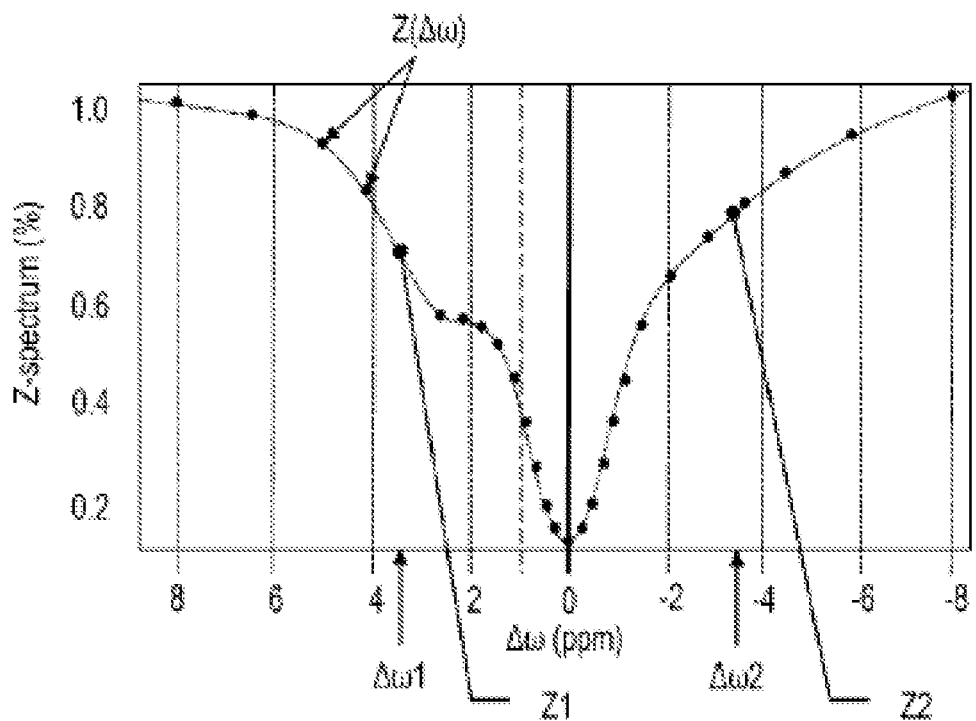

FIG. 6B illustrates the determination of a second non-limitative example of a biomarker produced from a Z-spectrum, as described previously in connection with FIGS. 3 to 5. Contrary to the preceding example, according to which the biomarker is obtained by subtraction of two areas ZA1 and ZA2, said biomarker can be produced by subtraction of two interpolated values of samples Z1 and Z2 of the Z-spectrum, said samples also being chosen such that the frequency offsets $\Delta\omega1$ and $\Delta\omega2$ which are respectively associated with them are symmetrical in relation to the frequency offset $\Delta\omega=0$. In the manner of the preceding example, if the interest is in amides, as indicated in FIG. 6B, the frequency offsets $\Delta\omega1=3.5$ ppm and $\Delta\omega2=-3.5$ ppm will be favoured. As a variant or in addition, if the interest is in amides, frequency offsets $\Delta\omega1=2$ ppm and $\Delta\omega2=-2$ ppm will be able to be chosen. Such a biomarker is called "magnetic transfer ratio asymmetry (MTRasym)". Such choices can form the subject of predetermined configurations or of options filled in by a user by means of a suitable human-machine input interface.

The increase in the density of the samples of the Z-spectrum leads to a higher resolution of the calculated MB0 maps but the acquisition of several samplings of the Z-spectrum results in a long calculation time and does not always equate to optimal results for mapping the parameter B0.

Besides the difficulties caused by the inhomogeneities of the static magnetic field B0 of the magnetic resonance imaging devices, a Z-spectrum is also affected by the inhomogeneities of the excitation field B1. In order to overcome this problem, a correction of the parameter B1 is also generally implemented in order to succeed in extracting a reliable CEST signal.

In order to alleviate these drawbacks, the WASAB1 sequence was proposed in order to make a more accurate determination of the resonant frequency of the "bulk" water protons possible. As mentioned previously, the inhomogeneities of the static magnetic field B0 and/or of the excitation field B1 are inevitable in magnetic resonance imaging. They cause distortions in the intensity of the acquired images. It is therefore necessary to implement a method for carrying out post-processing on a WASAB1 sequence in order to increase the relevance of said intensities and to determine precisely spatial information linked with the distribution of the magnetic fields B0 and B1 of the magnetic resonance imaging devices.

The WASAB1 acquisition is a magnetic resonance imaging acquisition sequence which makes it possible to simultaneously map the static magnetic field B0 and the excitation field B1 on the basis of Rabi oscillations induced by an off-resonance irradiation, which can be used to correct the previously mentioned inhomogeneities.

A Z-spectrum, resulting from a WASAB1 sequence, follows from a sampling according to several frequency offsets around the resonant frequency of water. This is then standardized using an image M0 acquired for frequencies remote from the frequency of water. The intensities of the WASAB1 $Z(\Delta\omega)$-spectrum of a single voxel can be modelled on the basis of the Bloch equations, as suggested for example and non-limitatively by the Publication:

$$Z(\Delta\omega) = \left| c - d \cdot \sin^2\left(\tan^{-1}\left(\frac{\gamma \cdot B1}{\Delta\omega - B0}\right)\right) \cdot \sin^2\left(\sqrt{(\gamma \cdot B1)^2 + (\Delta\omega - B0)^2} \cdot \frac{tp}{2}\right) \right|$$

where $\Delta\omega$ are the relative frequency offsets around the frequency of water, c, d, B1 and B0 are four free parameters. The parameters c and d describe the amplitude modulation independently of any frequency offset. The parameter B1 changes periodicity and B0 changes the axis of symmetry of the function, $\gamma$ is the gyromagnetic ratio and tp is the duration of the pulse.

The preceding function or model can be written in a simplified form such as:

$Z(\Delta\omega) = |c - d \cdot f(B0, B1, \Delta\omega)|$.

Figure 7:
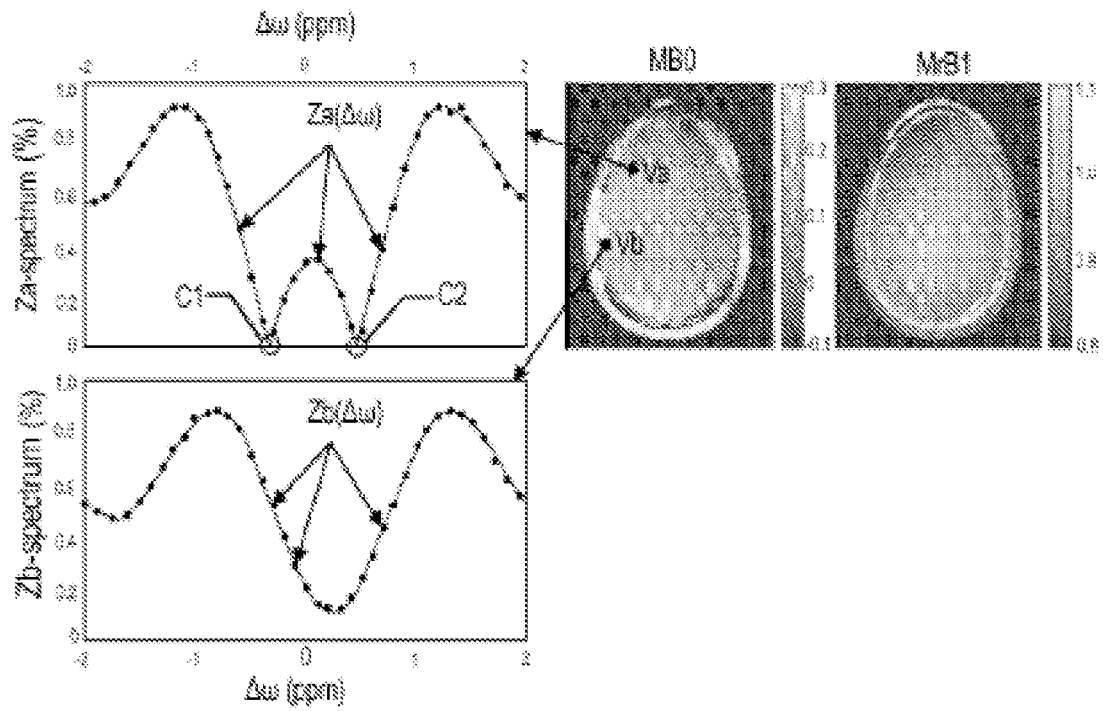

As indicated in FIG. 7, by adjusting these parameters for each elementary volume of interest having formed the subject of a WASAB1 sequence, such as the elementary volumes Va and Vb referenced by way of examples in FIG. 7, inhomogeneity maps MB0 and MrB1 can be produced in order to be used for quality control purposes in order to correct the imaging sequence acquired. The map MrB1 is obtained by dividing the map MB1 of WASAB1 by the nominal amplitude of the excitation field. Generally the nominal excitation magnetic field B1 used to acquire WASAB1 sequences is 3.7 µT. Despite the rapid acquisition times of WASAB1 sequences, the calculation times for implementing a post-processing are very slow, because they are based on an adjustment of a model with four parameters c, d, B0 and B1 derived from the Bloch equations.

At the current time, a single post-processing method has been proposed in the literature for determining the parameters B0 and B1 of a WASAB1 sequence, namely the method set out in the Publication.

Such a method consists of minimizing the quadratic sum of the residual errors between measurements and model with the aid of a non-linear optimization method. Such a known post-processing comprises two steps.

According to a first step, the space of the parameters c, d, B0 and B1 is sought exhaustively by means of a look-up table or grid with four dimensions in order to find the best parameters c, d, B0 and B1, for each voxel or elementary volume of interest. In fact, in order to avoid the local minima during the implementation of the adjustment step, taking into account the non-linearity of the model of the signal, the authors created this look-up table or grid with WASAB1 Z-spectra for all of the possible combinations of the four adjustment parameters before applying the adjustment algorithm as it is. The best combination of said parameters is the one that produces the smallest means squared error (or MSE) between the WASAB1 Z-spectrum acquired for a voxel and a spectrum simulated for a given set of parameters selected from said look-up table or grid.

The second step of such a post-processing method according to the state of the art is a step of adjustment of the model to the data according to which the previously found best combination of the parameters c, d, B0 and B1 is used as initial condition for a bounded minimization method using the Levenberg-Marquardt algorithm.

The numerous iterations which have to be implemented, voxel by voxel, accumulated at an elevated calculation time in order to implement the adjustment of the model to the data, lead to an implementation duration of the post-processing method greater than one hour. Such a duration is prohibitive for an application in the clinical field.

Moreover, the analytical model which describes the experimental signal resulting from a WASAB1 sequence predicts that, for certain sets of parameters, said signal—which could be considered as "theoretical" and of which only the magnitude is measured and known for different frequency offsets thus constituting a non-polarized experimental signal—can become negative. As indicated in FIG. 7, such a theoretical experimental signal can describe a varied polarity for a first elementary volume Va, contrary to what the measurements of the magnitude of such a theoretical experimental signal linked with a second elementary volume Vb translates into. As a magnetic resonance imaging device measures the magnitude of the theoretical experimental signal, the sign or polarity of said theoretical experimental signal is therefore "lost" during the acquisition. The Z-spectrum is a signal or set of samples which can be considered as "non-polarized". Thus, as the Za-spectrum associated with an elementary volume Va indicates, samples between "cusps" C1 and C2 describe magnitudes of a theoretical experimental signal with negative polarity. The measurement performed by the device therefore applies an absolute value filter to said theoretical experimental signal in order to put together a non-polarized experimental signal, hence the appearance of said cusps C1 and C2 on the latter. As a result, the model involves an absolute value for taking this measurement effect into account. The use of an absolute value makes the model complex to estimate, because it introduces discontinuities (cusps) in the function which it is sought to minimize. In addition, this compromises any implementation of relevant optimizations which would be possible if the sign of said signal was not "lost". FIG. 7 thus illustrates the measurement samples of the magnitude of two theoretical experimental WASAB1 signals respectively associated with two distinct elementary volumes Va and Vb. The Za-spectrum associated with a first elementary volume Va describes the magnitude of a theoretical experimental signal with changing or varied polarity, i.e. sometimes positive, sometimes negative, contrary to the Zb-spectrum associated with a second volume of interest Vb, which describes measurements of the magnitude of a theoretical experimental signal with systematically positive polarity. The Za-spectrum thus shows two minima, in the form of the cusps C1 and C2, between which the magnitude of the measured signal corresponds to a negative amplitude of the theoretical experimental signal associated with the first elementary volume Va, contrary to the samples situated on either side of said two cusps C1 and C2 which describe magnitudes of a theoretical experimental signal of which the amplitude, for the frequency offsets under consideration, has positive polarity. FIG. 7 moreover presents the previously mentioned parametric maps MB0 and MrB1 for the set of the elementary volumes of a slice of a human brain. It may be noted that the parameter B0 describes an inhomogeneous static magnetic field comprised between −0.1 ppm and +0.3 ppm.

The invention makes it possible to respond to all or some of the drawbacks raised by the known or previously mentioned solutions.

Of the numerous advantages brought about by the invention, it may be mentioned that:

- a method for carrying out post-processing on samples of an experimental signal, resulting from a WASAB1 sequence, is arranged to produce a robust and very rapid estimation, in relation to the times and difficulties of implementation according to the state of the art, of the parameters B0 and B1 describing respectively the static magnetic field and the excitation magnetic field of the medical imaging device performing the sampled measurement of a theoretical experimental signal;
- the implementation of such a post-processing method opens up, to the clinical field in particular, the CEST technology which is particularly promising for delivering a tool for decision and diagnosis linked with numerous pathologies;
- the estimation of said parameters B0 and B1, according to the invention, is based on the use of a model that is simpler since it includes only two parameters instead of four and also more stable than that described according to the state of the art, significantly reducing the aberrations in the estimation of said parameters B0 and B1 and, as a result, making it possible to produce parametric maps provided to the medical personnel, which are high quality and accurate;
- the implementation of a post-processing method according to the invention has a direct and high-performance application in any magnetic resonance imaging application for which a correction of inhomogeneities of said B0 and B1 fields is required.

For this purpose, the invention relates first of all to a method (100) for carrying out post-processing on a first set Z of samples $Z(\Delta\omega)$ of an experimental signal, resulting from a WASAB1 acquisition sequence by a medical magnetic resonance imaging device, linked with an elementary volume of an organ, the respective values of the samples $Z(\Delta\omega)$ of said first set Z describing the magnitude of a theoretical experimental signal according to frequency offsets $\Delta\omega$ with respect to the resonant frequency of water, said method being implemented by a processing unit of an imaging analysis system.

For a particularly effective and rapid implementation of such a method and, in fine, to produce accurate and robust estimations, such a method includes:

- a step of detecting the samples $Z(\Delta\omega)$ of the first set Z for which the polarities of the values of the theoretical experimental signal are considered to be certain and of constructing a second set Y of samples $Y(\Delta\omega)$ such that:
  - $Y(\Delta\omega)=Z(\Delta\omega)$ if the polarity of the theoretical experimental signal is considered to be certain and positive;
  - $Y(\Delta\omega)=-Z(\Delta\omega)$ if the polarity of said theoretical experimental signal is considered to be certain and negative;
- a step of adjusting a determined model to the second set Y of samples, the two parameters of said determined model describing respectively the static B0 and excitation B1 magnetic fields of the medical magnetic resonance imaging device, and of producing a first estimation of said parameters B0 and B1 of said model.

Where necessary, in order to improve the relevance of the estimations produced, a method according to the invention can include:

- a step of estimating the polarity of the values of the theoretical experimental signal measured for all or some of the samples $Z(\Delta\omega)$ from the thus-adjusted model and enhancing the second set Y of samples comprising a set of samples $Y(\Delta\omega)$ such that $Y(\Delta\omega)=Z(\Delta\omega)$ if the polarity of the theoretical experimental signal is estimated to be positive and $Y(\Delta\omega)=-Z(\Delta\omega)$ if the polarity of the theoretical experimental signal is estimated to be negative;
- a step of adjusting the determined model to the second set Y of samples and of producing a second estimation of said parameters B0 and B1.

According to a first embodiment, the step of detecting the samples $Z(\Delta\omega)$ of the first set Z, for which the polarities of the values of the theoretical experimental signal the magnitude of which is measured are certain, can include:

- a first sub-step, for any sample $Z(\Delta\omega)$, from the largest negative frequency offset in absolute values to such a frequency offset of zero, of extrapolating the value of said sample from the value or values of one or more samples respectively associated with different frequency offsets;
- a second sub-step, for any sample $Z(\Delta\omega)$, from the largest frequency offset to such a frequency offset of zero, of extrapolating the value of said sample from the value or values of one or more samples respectively associated with different frequency offsets.

According to this first embodiment, the polarity of the theoretical experimental signal for a frequency offset $\Delta\omega$ can be determined by the extrapolated value sign $Z(\Delta\omega)'$ of the sample $Z(\Delta\omega)$ for said frequency offset. Said polarity of the theoretical experimental signal for a given frequency offset $\Delta\omega$ is considered to be certain and positive as long as an extrapolated value $Z(\Delta\omega)'$ of a sample $Z(\Delta\omega)$ remains positive.

According to this first embodiment of the step of detecting the samples $Z(\Delta\omega)$ of the first set Z for which the polarities of the values of the theoretical experimental signal the magnitude of which is measured are certain, the extrapolation of the value of a sample $Z(\Delta\omega)$ can consist, for the first and second sub-steps, of a prior evaluation of the largest interval between the respective values of two samples $Z(\Delta\omega)$ associated with successive frequency offsets and of the subtraction of said largest interval from the value of the sample associated with the frequency offset that is greater in absolute values than that associated with the sample $Z(\Delta\omega)$ the value of which is extrapolated.

As a variant, the invention provides a second embodiment of the step of detecting the samples $Z(\Delta\omega)$ of the first set Z for which the polarities of the values of the theoretical experimental signal measured are certain. According to this second embodiment, said step can include:
- a first sub-step of calculating the derivative of a first discrete signal resulting from an ordering of the samples of said first set Z according to increasing frequency offsets;
- a second sub-step of detecting any discontinuity of the polarity of said derivative.

The polarity of the measurement of the theoretical experimental signal is considered to be certain for the set of the frequency offsets $\Delta\omega$ under consideration, said polarity being inverted when any discontinuity is detected in the polarity of said derivative.

Whatever the embodiment of the step of detecting the samples $Z(\Delta\omega)$ of the first set Z translating measurements of the magnitude of the theoretical experimental signal of which the polarities of the values of said theoretical experimental signal are certain, the steps necessary for the estimation of the parameters B0 and B1 linked with an elementary volume of the organ can be repeated in order to produce a plurality of estimations of said parameters B0 and B1 linked respectively with a plurality of elementary volumes of said organ.

In this case, in order to deliver an invaluable tool for calibrating the imaging device or for diagnosing certain human or animal pathologies, a method according to the invention can include a step of producing an image in the form of a parametric map, the pixels of which encode respectively the values of the estimated parameter B0 or B1 for elementary volumes of interest.

The invention then provides that such a method can include a step of bringing about a display of said produced image by a human-machine output interface of the imaging analysis system.

According to a second subject, the invention relates to an imaging analysis system including a processing unit, means for communicating with the outside world and storage means. The communication means of such a system are arranged to receive, from said outside world, experimental data resulting from a WASAB1 acquisition sequence of data produced by spectral sampling of an elementary volume of an organ and the storage means include program instructions the interpretation or execution of which by said processing unit brings about the implementation of a method for carrying out post-processing on a first set Z of samples $Z(\Delta\omega)$ of an experimental signal resulting from a WASAB1 acquisition sequence according to the invention.

According to a third subject, the invention relates to a computer program product including one or more program instructions that can be interpreted by the processing unit of an imaging analysis system, said program being loadable onto storage means of said system, characterized in that the interpretation of said instructions by said processing unit brings about the implementation of a method for carrying out post-processing on a first set Z of samples $Z(\Delta\omega)$ of a continuous theoretical experimental signal resulting from a WASAB1 acquisition sequence according to the invention.

According to a fourth subject, the invention relates to a computer-readable storage medium including the program instructions of such a computer program product.

Figure 8:
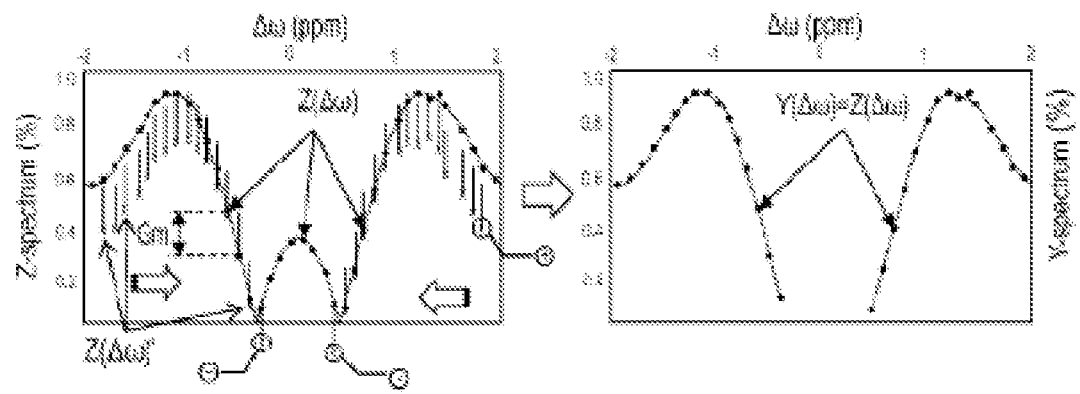
Figure 9:
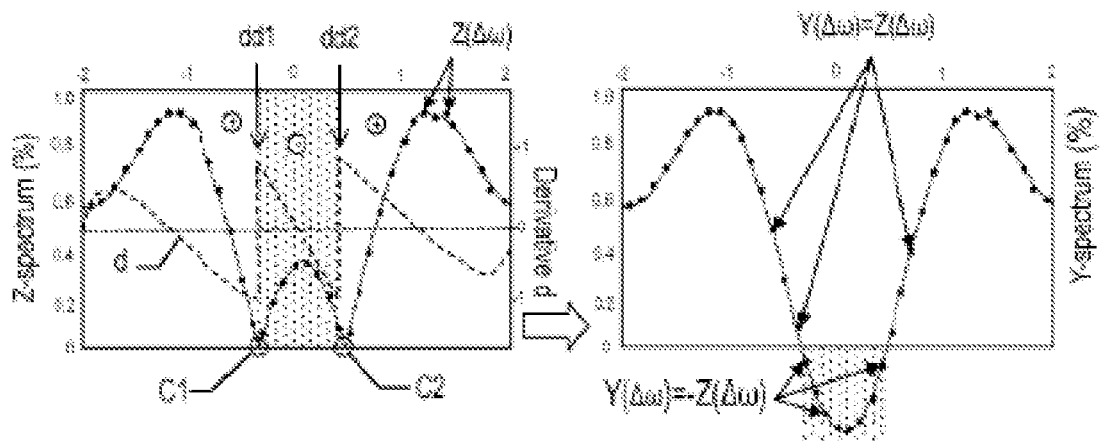
Figure 10:
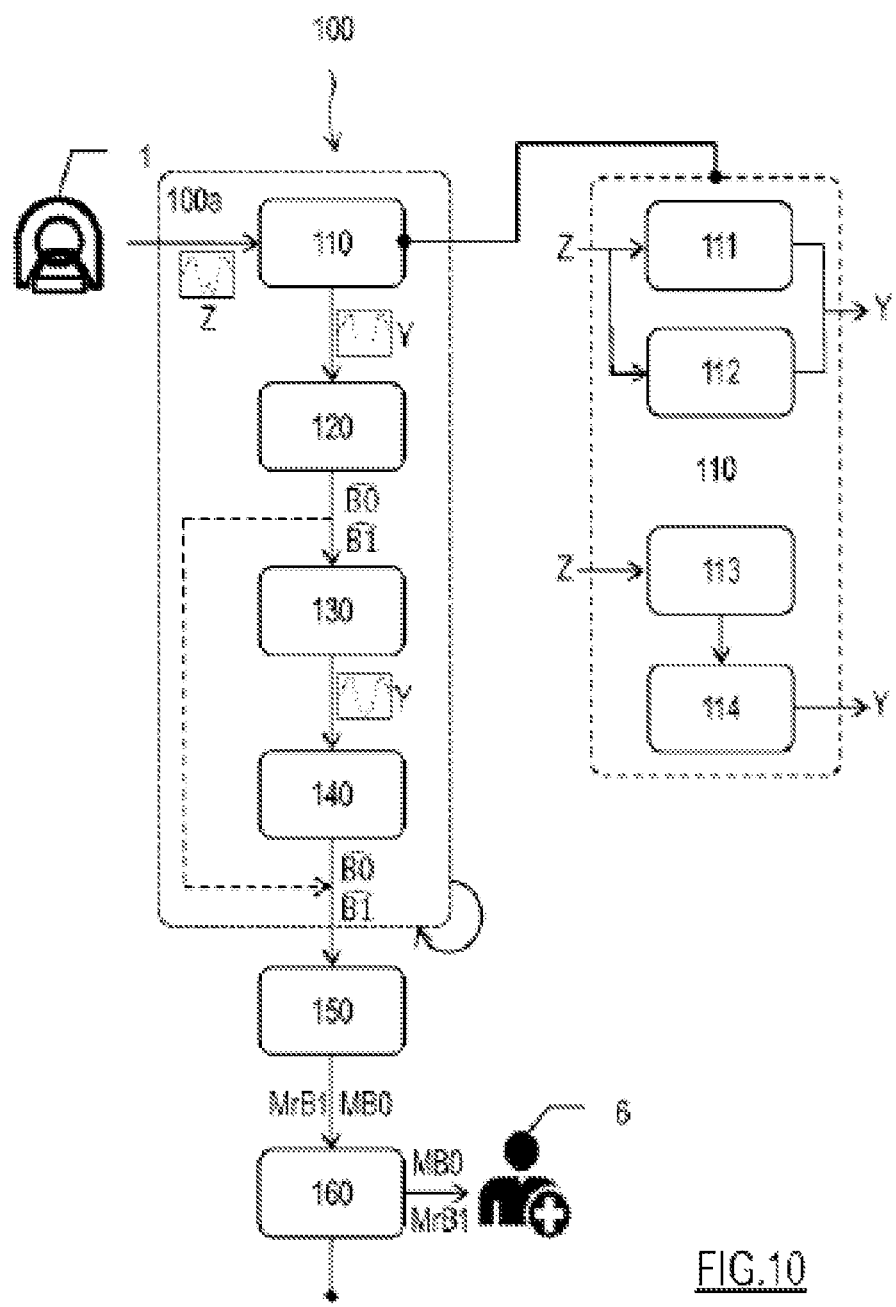

Other features and advantages will become more clearly apparent on reading the following description and on examining the figures which accompany it, in which:

FIG. 1, already described, illustrates a simplified description of a system for analysing images obtained by nuclear magnetic resonance;

FIG. 2, already described, illustrates a simplified description of a variant of a system for analysing images obtained by nuclear magnetic resonance;

FIG. 3, already described, shows a first example of a Z-spectrum in the form of a set of ordered samples $Z(\Delta\omega)$ linked with an elementary volume of interest of an organ;

FIG. 4, already described, shows the same example of a Z-spectrum in the form of a set of samples $Z(\Delta\omega)$ ordered like that in FIG. 3, superimposed on an estimated continuous experimental signal after adjustment of a determined model to the samples of said Z-spectrum according to the state of the art;

FIG. 5, already described, shows the same example of a Z-spectrum in the form of a set of samples $Z(\Delta\omega)$ ordered like that in FIG. 3, superimposed on an estimated continuous experimental signal after adjustment of a determined model to the samples of said Z-spectrum according to the state of the art, after correction and fine-tuning of the medical imaging device;

FIG. 6A, already described, shows an estimation of a first biomarker from samples of a Z-spectrum according to the state of the art after correction and fine-tuning of the imaging device;

FIG. 6B, already described, shows an estimation of a second biomarker from samples of a Z-spectrum according to the state of the art after correction and fine-tuning of the imaging device;

FIG. 7, already described, shows several examples of a Z-spectrum in the form of a set of samples $Za(\Delta\omega)$, $Zb(\Delta\omega)$ ordered for a plurality of elementary volumes Va, Vb of a human brain, as well as parametric maps associated with the static B0 and excitation B1 fields of a medical imaging device;

FIG. 8 describes a first embodiment of a step of a method for carrying out post-processing on a WASAB1 spectrum, according to the invention, with the aim of detecting the samples of said spectrum describing magnitudes of a theoretical experimental signal the polarity of which is considered to be positive at the frequency offsets under consideration;

FIG. 9 describes a second embodiment of a step of a method for carrying out post-processing on a WASAB1 spectrum, according to the invention, with the aim of detecting the samples of said spectrum describing magnitudes of a theoretical experimental signal the polarity of which is considered to be known at the frequency offsets under consideration;

FIG. 10 illustrates a functional algorithm example of a method for carrying out post-processing on a WASAB1 spectrum, according to the invention.

In connection with FIG. 10, an example of a method will now be described for carrying out post-processing 100, according to the invention, on a first set Z of samples $Z(\Delta\omega)$ of an experimental signal 10, 12, resulting from a WASAB1 acquisition sequence by a medical magnetic resonance imaging device 1, such as the one described previously in connection with FIG. 1 or 2.

Such a method 100 includes a processing 100a which can be implemented iteratively for a plurality of elementary volumes of an organ of interest.

Such a processing 100a, implemented for a voxel or elementary volume, includes two steps 110 and 120, possibly supplemented by two steps 130 and 140, as will be seen later in connection with two advantageous embodiments. A first objective of this processing 100a consists of constructing, in a step 110, a second set Y of samples from the set of samples of a first Z-spectrum following from a WASAB1 sequence. Contrary to said Z-spectrum, for which the samples $Z(\Delta\omega)$ can describe an amplitude of a theoretical experimental signal 10, 12 the polarity of which is uncertain or variable, the second set Y of samples includes samples $Y(\Delta\omega)$ describing amplitudes of said theoretical experimental signal 10, 12 the polarity of which is known. Such a construction of the second set Y will be examined successively in connection with FIGS. 8 and 9, which describe two distinct embodiments.

According to a first embodiment illustrated jointly by FIGS. 8 and 10, the second set Y of samples can be put together in the form of a sub-set of the Z-spectrum for which the samples $Y(\Delta\omega)$ are respectively equal to the samples $Z(\Delta\omega)$ when the polarity of the theoretical experimental signal the magnitude of which is measured is certain and positive. For this purpose, step 110 includes sub-steps 111 and 112, such that certain samples of the first set Z are moved apart and therefore not reproduced in the second set Y if the polarity of the theoretical experimental signal the magnitude of which is measured, at the frequency offsets $\Delta\omega$ under consideration, is uncertain, or even in all likelihood negative.

As a variant, in connection with the example in FIG. 9, when step 110 includes sub-steps 113 and 114, the samples $Y(\Delta\omega)$ of the second set Y of samples are respectively equal to the samples $Z(\Delta\omega)$ of the first set Z when the polarity of the theoretical experimental signal the magnitude of which is measured is certainly positive. Said samples $Y(\Delta\omega)$ are respectively equal to the $-Z(\Delta\omega)$ when the polarity of said theoretical experimental signal the magnitude of which is measured is certainly negative. The second set Y of samples is therefore "polarized" contrary to the Z-spectrum.

Whatever the embodiment used, the model for estimating the parameters B0 and B1, when it is adjusted, in a step 120 or even 140, to the second set Y of samples of which the polarity of the theoretical experimental signal is known the magnitude of which is measured at the frequency offsets under consideration, no longer integrates the notion of absolute values, contrary to the model according to the state of the art. Owing to the contribution of the invention, said model is therefore simpler to adjust and more robust. It will also be seen that this model can be "reduced" from four parameters to two parameters, increasing by a factor of one hundred the performance in implementing a post-processing method 100 according to the invention in relation to the state of the art.

A first embodiment of the first step 110 of a post-processing method 100 according to the invention will be examined in connection with FIGS. 8 and 10. Said step 110 consists of detecting the samples $Z(\Delta\omega)$ of the first set Z for which the polarity of the values of the theoretical experimental signal the magnitude of which is measured is certain and positive. Said step 110 moreover consists of constructing a second set Y of samples $Y(\Delta\omega)$ such that $Y(\Delta\omega)=Z(\Delta\omega)$ from the single samples $Z(\Delta\omega)$ previously detected as describing measurements of a theoretical experimental signal with a positive polarity at the frequency offsets $\Delta\omega$ under consideration. FIG. 8 illustrates, in the left-hand part, a Z-spectrum the samples $Z(\Delta\omega)$ of which are represented by points and are ordered according to increasing frequency offsets, in this particular case from a frequency offset equal to $-2$ ppm to a frequency offset equal to $+2$ ppm. This first set Z of samples only includes positive values translating measurements of the magnitude of a theoretical experimental WASAB1 signal the polarity of which is not known a priori. A second set Y of samples constructed from the first set Z is shown in the right-hand part of said FIG. 8, according to a same ordering of frequency offsets $\Delta\omega$. The objective of this step 110 is to construct the set Y in such a way that it only includes samples $Y(\Delta\omega)$ that are identical to the $Z(\Delta\omega)$ of the first set Z if, and only if, said samples $Z(\Delta\omega)$ translate respectively measurements of the magnitude of a theoretical experimental signal the polarity of which is certain and positive at the frequency offsets $\Delta\omega$ under consideration. The samples $Z(\Delta\omega)$ of the first set Z translating measurements of a theoretical experimental signal the polarity of which is uncertain, or even in all likelihood negative, at the frequency offsets under consideration, are moved apart. The second set Y of samples is therefore, as indicated in FIG. 8, a sub-set of the first set Z. The set Y can be considered to be a set of polarized samples since the polarity of the theoretical experimental signal the magnitude of which is measured is known for the frequency offsets under consideration.

In order to detect the samples $Z(\Delta\omega)$ describing measurements of a theoretical experimental signal with a certainly positive polarity at the frequency offsets $\Delta\omega$ under consideration, step 110 includes a first sub-step 111 consisting, for any sample $Z(\Delta\omega)$, from the largest negative frequency offset $\Delta\omega$, in absolute values, to such a frequency offset of zero, of extrapolating the value of said sample $Z(\Delta\omega)$ from the value or values of one or more samples respectively associated with negative frequency offsets which are greater in absolute values. By way of preferred but non-limitative example, according to FIG. 8, the extrapolated value $Z(\Delta\omega)'$, represented by an 'x' in FIG. 8, of a sample $Z(\Delta\omega)$, can consist of a prior evaluation of the largest interval, given the reference Gm in FIG. 8, between the respective values of two samples $Z(\Delta\omega)$ associated with successive frequency offsets. Said step 111 then consists of calculating the extrapolated value $Z(\Delta\omega)'$ by subtracting said largest interval Gm from the value of the sample associated with the frequency offset that is greater in absolute values than the one associated with the sample $Z(\Delta\omega)$ the value of which is extrapolated. The vertical bars, connected to the extrapolated values represented by 'x' in FIG. 8, thus illustrate this extrapolation operation, performed from left to right, of the samples $Z(\Delta\omega)$ from the frequency offset $\Delta\omega$ close to $-2$ ppm to the frequency offset close to 0 ppm. The polarity of the theoretical experimental signal the measured magnitude of which corresponds to the sample $Z(\Delta\omega)$ is considered as being certain and positive as long as the extrapolated values $Z(\Delta\omega)'$ remain positive or as long as the frequency offset $\Delta\omega$ under consideration is not zero. As soon as an extrapolated value $Z(\Delta\omega)'$ is negative, this means that the discrete experimental signal described by the samples of the first set Z has a cusp. Step 111 stops, the subsequent samples, i.e. those associated with the greater frequency offsets $\Delta\omega$, are considered as describing measurements of a theoretical experimental signal the polarity of which is uncertain or negative. Only the preceding samples are detected as describing measurements of the magnitude of a theoretical experimental signal with a positive polarity at the frequency offsets under consideration. These detected samples are thus reproduced in the second set Y such that $Y(\Delta\omega)=Z(\Delta\omega)$. Thus, in the example of FIG. 8, at the end of the implementation of sub-step 111, only the first sixteen samples are considered favourably for putting together the set Y. The first sample $Z(\Delta\omega)$, i.e. the one that is associated with the largest frequency offset in absolute values, is, hypothetically, detected favourably for initializing step 111.

Step 110 moreover includes a sub-step 112 describing a behaviour mirroring that of sub-step 111. It consists of running through the samples $Z(\Delta\omega)$, from right to left in FIG. 8, i.e. from the largest frequency offset $\Delta\omega$ to a frequency offset of zero, in order to detect the samples $Z(\Delta\omega)$ of the first set Z translating measurements of the magnitude of a theoretical experimental signal the polarity of which is certain and positive at the frequency offsets under consideration. It moreover consists of enhancing the second set Y of samples starting from these single detected samples, such that $Y(\Delta\omega)=Z(\Delta\omega)$ and of moving apart the samples $Z(\Delta\omega)$ describing measurements of the magnitude of a theoretical experimental signal with an uncertain or in all likelihood negative polarity for the frequency offsets under consideration.

For this purpose, the sub-step 112 consists, for any sample $Z(\Delta\omega)$, from the largest positive frequency offset $\Delta\omega$ to such a frequency offset of zero, of extrapolating the value of said sample $Z(\Delta\omega)$ from the value or values of one or more samples $Z(\Delta\omega)$ respectively associated with greater positive frequency offsets $\Delta\omega$. By way of preferred but non-limitative example, according to FIG. 8, the extrapolated value $Z(\Delta\omega)'$, represented by an 'x' in FIG. 8, of a sample $Z(\Delta\omega)$ can consist of the calculation of the extrapolated value $Z(\Delta\omega)'$ of a sample $Z(\Delta\omega)$ by subtracting the largest interval Gm between the respective values of two samples associated with two consecutive frequency offsets, interval Gm already mentioned within the framework of sub-step 111, from the value of the sample associated with the frequency offset smaller than the one associated with the sample $Z(\Delta\omega)$ the value of which is extrapolated. The vertical bars, connected to the extrapolated values represented by 'x' in FIG. 8, thus illustrate this extrapolation operation, performed from right to left, of the samples $Z(\Delta\omega)$ from the frequency offset $\Delta\omega$ close to +2 ppm to the frequency offset $\Delta\omega$ close to 0 ppm. The polarity of the theoretical experimental signal the magnitude $Z(\Delta\omega)$ of which is measured for the frequency offsets $\Delta\omega$ is considered as being certain and positive as long as the extrapolated values $Z(\Delta\omega)'$ remain positive and as long as the frequency offset $\Delta\omega$ under consideration is not zero. As soon as an extrapolated value $Z(\Delta\omega)'$ is negative, this means that the discrete signal, described by the samples of the first set Z, has a cusp. Sub-step 112 stops, the subsequent samples, i.e. those associated with the smaller frequency offsets $\Delta\omega$, are considered as describing measurements of a theoretical experimental signal the polarity of which is uncertain or negative. Only the preceding samples are detected as describing measurements of a theoretical experimental signal the polarity of which is positive at the frequency offsets under consideration. These samples are thus reproduced in the second set Y such that $Y(\Delta\omega)=Z(\Delta\omega)$. Thus, in the example of FIG. 8, at the end of the implementation of sub-step 112, only the first fifteen samples are considered favourably for enhancing the set Y, the sample $Z(\Delta\omega)$ associated with the largest frequency offset being, hypothetically, detected favourably for initializing sub-step 112.

Sub-steps 111 and 112 have been described through a preferred implementation example according to which working out the extrapolated value $Z(\Delta\omega)'$, represented by an 'x' in FIG. 8, of a sample $Z(\Delta\omega)$ can consist of a prior evaluation of the largest interval, given the reference Gm in FIG. 8, between the respective values of two samples $Z(\Delta\omega)$ associated with successive frequency offsets then of the subtraction of said largest interval Gm from the value of the sample associated with the frequency offset that is greater in absolute values than the one associated with the sample $Z(\Delta\omega)$ the value of which is extrapolated. Other extrapolation techniques could, as a variant or in addition, be implemented. It can more generally be considered that the extrapolated value $Z(\Delta\omega i)'$ of a sample $Z(\Delta\omega i)$, i.e. the $i^{th}$ sample associated with the frequency offset $\Delta\omega 1$ of the n samples available, can be written according to the relationship: $Z(\Delta\omega i)'=f(Z(\Delta\omega 1), Z(\Delta\omega 2), \ldots, Z(\Delta\omega n), P)$ where n is a positive integer, $f$ is any function whatever and P is any parameter whatever, possibly plural. Thus, according to the preceding example, the function $f$ has the aim of calculating the interval Gm and of performing the subtraction operation and P=1 determines the rank of the sample preceding the one the value $Z(\Delta\omega i)$ of which is extrapolated. As a variant, according to a second non-limitative implementation example, the function $f$ could consist of the calculation of the average value of values of P samples subsequent to the sample the value of which it is sought to extrapolate. Other combinations of the pair $(f, P)$ could, as a variant, be used without departing from the scope of the present invention.

FIG. 9 illustrates a second embodiment of step 110 of a post-processing method 100 according to the invention. Said step 110 consists of detecting the samples $Z(\Delta\omega)$ of the first set Z for which the polarity of the values of the theoretical experimental signal the magnitude of which is measured is certain. Said step 110 moreover consists of constructing a second set Y of samples $Y(\Delta\omega)$ such that $Y(\Delta\omega)=Z(\Delta\omega)$ when the samples $Z(\Delta\omega)$ describe measurements of a theoretical experimental signal with a certain and positive polarity and such that $Y(\Delta\omega)=-Z(\Delta\omega)$ from the single samples $Z(\Delta\omega)$ describing measurements of a theoretical experimental signal with a certain and negative polarity. FIG. 9, like the previously described FIG. 8, illustrates, in the left-hand part, a Z-spectrum the samples $Z(\Delta\omega)$ of which are represented by points and are ordered according to increasing frequency offsets, in this particular case from −2 ppm to +2 ppm. This first set Z of samples includes positive values translating measurements of the magnitude of a theoretical experimental WASAB1 signal the polarity of which is not known a priori. A second set Y of samples constructed from the first set Z is shown in the right-hand part of said figure, according to a same ordering of the frequency offsets $\Delta\omega$. The objective of this step 110 is to construct the set Y in such a way that it only includes samples $Y(\Delta\omega)$ identical to those $Z(\Delta\omega)$ of the first set Z if, and only if, said samples $Z(\Delta\omega)$ translate respectively measurements of the magnitude of a theoretical experimental signal the polarity of which is certain and positive at the frequency offsets $\Delta\omega$ under consideration. The samples $Z(\Delta\omega)$ of the first set Z translating measurements of the magnitude of a theoretical experimental signal the polarity of which is certainly negative at the frequency offsets under consideration are such that $Y(\Delta\omega)=-Z(\Delta\omega)$. The second set Y of samples is therefore, as indicated in FIG. 9, a set of samples which can be considered to be "polarized" since the polarity of the theoretical experimental signal is known at the frequency offsets under consideration.

In order to detect the samples $Z(\Delta\omega)$ describing measurements of the magnitude of a theoretical experimental signal with a certainly positive or negative polarity for the frequency offsets $\Delta\omega$ under consideration, step 110 includes a first sub-step 113 consisting, for any sample $Z(\Delta\omega)$ from the largest negative frequency offset $\Delta\omega$, of the calculation of the derivative of the discrete Z signal resulting from an ordering of the samples $Z(\Delta\omega)$ according to increasing frequency offsets $\Delta\omega$. This derivative appears in the form of a discontinuous curve in FIG. 9. Taking into account the presence of cusps C1 and C2 of said discrete Z signal, the derivative has two clear discontinuities dd1 and dd2 of its sign or polarity. The case would be quite different if such cusps were not present, i.e. if the polarity of the theoretical experimental signal sampled were constant. Step 110 includes a second sub-step 114 of detecting such discontinuities of the polarity of said derivative, the polarity of the measurement of the theoretical experimental signal for one or more successive frequency offsets $\Delta\omega$ being inverted during a discontinuity of the polarity of said derivative. Thus, according to the example illustrated by FIG. 9, step 110 makes it possible to consider respectively, upstream and downstream of said cusps C1 and C2, i.e. respectively upstream and downstream of said discontinuities dd1 and dd2, that the polarity of the theoretical experimental signal is certain and positive. Reciprocally, said polarity of the theoretical experimental signal is considered to be certain and negative for the range, appearing greyed out, of the frequency offsets comprised between said cusps C1 and C2. As the shape of the measured signal is substantially a 'V', two discontinuities of the sign of the derivative are expected, at the most. This is how the samples $Z(\Delta\omega)$ detected as describing measurements of the magnitude of a theoretical experimental signal with a positive polarity at the frequency offsets under consideration are reproduced in the second set Y such that $Y(\Delta\omega)=Z(\Delta\omega)$ and how the samples $Z(\Delta\omega)$ detected as describing measurements of the magnitude of a theoretical experimental signal with a negative polarity at the frequency offsets under consideration are reproduced in the second set Y such that $Y(\Delta\omega)=-Z(\Delta\omega)$. Thus, in the example of FIG. 9, at the end of the implementation of sub-step 114, the set of the samples of the first set Z is considered favourably for putting together the second set Y of polarized samples, the polarity of the measurement of the theoretical experimental signal being considered to be certain for the set of the frequency offsets $\Delta\omega$ under consideration.

Through the implementation of step 110, the polarity of the theoretical experimental signal from which the second set Y of samples $Y(\Delta\omega)$ follows is known at each frequency offset under consideration. Contrary to the state of the art, for which the model of the intensities of a WASAB1 Z-spectrum, on the basis of the Bloch equations, is expressed, in a simplified form, such that a sample of said $Z(\Delta\omega)$-spectrum is a function, in absolute values, of four free parameters c, d, B1 and B0, the use of the second set Y of "polarized" samples, instead of the Z-spectrum, makes it possible to get past the problem of complexity associated with the absolute value since the polarity of the theoretical experimental signal is known for each sample $Y(\Delta\omega)$. Thus, the model of the intensities of the Y-spectrum can be written in a simplified form such that $Y(\Delta\omega)=c-d \cdot f(B0, B1, \Delta\omega)$.

The parameters of this model can advantageously be obtained by minimizing the sum of the squared error:

$$[\hat{c}, \hat{d}, \widehat{B_0}, \widehat{B_1}] = \underset{c,d,B_0,B_1}{\mathrm{argmin}}\ SSE(c, d, B_0, B_1)$$

for which:

$$SSE(c, d, B_g, B_1) = \sum_{\Delta\omega}(\gamma(\Delta\omega) - (c - d \times f(B_0, B_1, \Delta\omega)))^2$$

is the sum of the squared errors.

Assuming that the parameters B0 and B1 are constant, the model becomes linear in the parameters c and d. These latter can be replaced with their estimation at least of the least squares which is expressed analytically as a function of B0 and B1. By replacing these parameters c and d with their estimations as a function of B0 and B1, the model only has two explicit parameters: B0 and B1. The two linear parameters have been made implicit. According to the invention, the model is no longer a model with four parameters, but one with two parameters, which makes the estimation of B0 and B1 more rapid by two orders of magnitude, more robust and less susceptible to the local minima.

In fact, the model can be written, for T elementary volumes, in a matrix form, such that $Y=M(B0, B1)\beta$, where $Y=[Y(\Delta\omega 1), \ldots, Y(\Delta\omega n)]^T$ describes a vector containing the n samples $Y(\Delta\omega)$, per elementary volume, for the frequency offsets $\Delta\omega 1$ to $\Delta\omega n$, M is a matrix with a size of 2n containing the regressors or variables of the model, namely:

$$M(B0, B1) = \begin{bmatrix} 1 & -\hat{f}(B0, B1, \Delta\omega 1) \\ \vdots & \vdots \\ 1 & -\hat{f}(B0, B1, \Delta\omega n) \end{bmatrix}$$

Moreover, $\beta=[c, d]^T$ is a vector with a size of two, for each elementary volume, containing the linear parameters c and d. The matrix M depends explicitly on the non-linear parameters of the model, in this particular case B0 and B1. Thus, the sum of the squared errors, expressed previously, can now be written in the form:

$$SSE(B0,B1,\beta)=(Y-M\beta)^T(Y-M\beta)$$

For constant B0 and B1, the optimum estimation of $\beta$ which minimizes the sum of the squared errors can be calculated analytically such that:

$$\hat{\beta}=(M^TM)^{-1}M^TY$$

If this estimation of $\beta$ is replaced in the preceding expression, the following is obtained:

$$SSE_{min}(B0,B1)=Y^T(1-M(M^TM)^{-1}M^T)Y$$

The parameters c and d can be estimated with:

$$\hat{\beta}=(\hat{M}^T\hat{M})^{-1}\hat{M}^TY$$

where:

$$\hat{M}=M(\widehat{B0}, \widehat{B1})$$

In this way, a post-processing method 100 according to the invention includes a step 120 of adjusting a determined model to the second set Y of polarized samples, the set previously produced in step 110, the two parameters of said determined model describing respectively the static B0 and excitation B1 magnetic fields of the medical magnetic resonance imaging device 1 as described by way of example by FIG. 1. Said step 120 thus produces a first estimation of said parameters B0 and B1 of said model.

By way of preferred example, although this advantageous embodiment is optional, the invention provides that a method 100 includes two steps 130 and 140 with the aim jointly of producing a second estimation of said parameters B0 and B1, after possible enhancement of the second set Y of polarized samples.

In fact, since step 120 has delivered a first estimation of the parameters of the model, it is possible to accurately determine the samples of the Z-spectrum corresponding to measurements of the magnitude of the theoretical experimental signal even though the polarity of it is negative for the frequency offsets under consideration. It can be particularly advantageous to enhance the second set Y of samples, in particular if the latter results from an implementation of the first embodiment example of step 110, i.e. when said step 110 includes the sub-steps 111 and 112. In this case, said second set Y of samples is a sub-set of the first set Z the samples $Y(\Delta\omega)$ of which are equal respectively to the samples $Z(\Delta\omega)$ when the polarity of the theoretical experimental signal is positive, the other samples of Z being moved apart in order to produce the set Y.

In this case, the invention provides that the method 100 can include an optional step 130 of determining the polarity of the values of the theoretical experimental signal for all or some of the samples $Z(\Delta\omega)$ from the model adjusted in this way in step 120 and of constructing the second set Y of samples again such that $Y(\Delta\omega)=Z(\Delta\omega)$ if the polarity of the theoretical experimental signal is estimated to be positive and $Y(\Delta\omega)=-Z(\Delta\omega)$ if the polarity ($\Delta\omega$) of the theoretical experimental signal is estimated to be negative. Owing to the successive implementation of steps 111, 112, 120 and 130, the second set Y of samples is more extensive than the one obtained after the single implementation of step 110, like the one obtained when said step 110 includes the previously described sub-steps 113 and 114.

A method 100 can then include a new iteration of step 120, represented by a step 140 in FIG. 10, subsequent to step 130, of adjusting the model to the thus enhanced set Y of polarized samples. Step 140 thus produces a new estimation of the parameters of the model using more samples without significantly penalizing the implementation of the method 100 taking into account the benefit resulting from the use of a simplified model in relation to that according to the state of the art.

As the parameters B0 and B1 are in particular estimated accurately and rapidly at the end of one instance of the processing 100a for an elementary volume of interest, the invention provides that a method 100 according to the invention includes as many iterations of said processing 100a for producing estimations in particular of the parameters B0 and B1 for a plurality of volumes of interest.

A method 100 can then include a step 150 of producing an image in the form of a parametric map, such as the map MB0 or MrB1 described previously in connection with FIG. 7, the pixels of which encode respectively the values of the parameter B0 or B1 estimated for elementary volumes of interest. This or these parametric map or maps can moreover be displayed by a suitable human-machine output interface, such as the interface 5 described in connection with FIGS. 1 and 2, in order that a user 6 of an imaging system S can note the estimations of said parameters B0 or B1, or even any other biomarker that can be produced from said parameters. The implementation of a method for carrying out post-processing on a first set Z of samples $Z(\Delta\omega)$ describing the magnitude of a theoretical experimental signal resulting from a WASAB1 acquisition sequence by a medical magnetic resonance imaging device 1 becomes perfectly usable in the clinical field, thus opening the door to said clinical field for the CEST technique in particular, in order to quantify one or more biomarkers linked with a chemical species of interest of a human or animal organ in order, in fine, to characterize different lesions with altered metabolic properties. The invention cannot be reduced to this single use. It thus has a key place in any magnetic resonance imaging application for which a correction of inhomogeneities of static B0 and excitation B1 fields is required.

The invention claimed is:

1. A method for carrying out post-processing on a first set Z of samples $Z(\Delta\omega)$ of an experimental signal resulting from a WASAB1 acquisition sequence by a medical magnetic resonance imaging device, linked with an elementary volume of an organ, the respective values of the samples $Z(\Delta\omega)$ of said first set Z describing the magnitude of a theoretical experimental signal according to frequency offsets $\Delta\omega$ with respect to the resonant frequency of water, said method being implemented by a processing unit of an imaging analysis system, and comprising:
   detecting the samples $Z(\Delta\omega)$ of the first set Z for which the polarities of the values of the theoretical experimental signal are considered to be certain and of constructing a second set Y of samples $Y(\Delta\omega)$ such that:
   a. $Y(\Delta\omega)=Z(\Delta\omega)$ if the polarity of the theoretical experimental signal is considered to be certain and positive;
   b. $Y(\Delta\omega)=-Z(\Delta\omega)$ if the polarity of said theoretical experimental signal is considered to be certain and negative; and
   adjusting a determined model to the second set Y, the two parameters of said determined model describing respectively the static B0 and excitation B1 magnetic fields of the medical magnetic resonance imaging device, and of producing a first estimation of said parameters B0 and B1 of said model.

2. The method according to claim 1, including:
   estimating the polarity of the values of the theoretical experimental signal for all or some of the samples $Z(\Delta\omega)$ from the thus-adjusted model and of enhancing the second set Y of samples comprising a set of samples $Y(\Delta\omega)$ such that $Y(\Delta\omega)=Z(\Delta\omega)$ if the polarity of the theoretical experimental signal is estimated to be positive and $Y(\Delta\omega)=-Z(\Delta\omega)$ if the polarity of said theoretical experimental signal is estimated to be negative; and
   adjusting the determined model to the second set Y of samples and of producing a second estimation of said parameters B0 and B1.

3. The method according to claim 1, wherein:
   detecting the samples $Z(\Delta\omega)$ of the first set Z, for which the polarities of the values of the theoretical experimental signal are considered to be certain, includes:
   for any sample $Z(\Delta\omega)$, from the largest negative frequency offset (Aw) in absolute values to such a frequency offset of zero, of extrapolating the value of said sample from the value or values of one or more samples respectively associated with different frequency offsets;
   for any sample $Z(\Delta\omega)$, from the largest frequency offset ($\Delta\omega$) to such a frequency offset of zero, of extrapolating the value of said sample from the value or values of one or more samples respectively associated with different frequency offsets;
   wherein:
   the polarity of the theoretical experimental signal for any frequency offset $\Delta\omega$ is determined by the extrapolated value sign $Z(\Delta\omega)'$ of the sample $Z(\Delta\omega)$ for said frequency offset, and
   the polarity of the theoretical experimental signal for a given frequency offset $\Delta\omega$ is considered to be certain and positive as long as an extrapolated value $Z(\Delta\omega)'$ of a sample $Z(\Delta\omega)$ remains positive.

4. The method according to claim 3, wherein the extrapolation of the value of a sample $Z(\Delta\omega)$ comprises, for the first and second sub-steps, of a prior evaluation of the largest interval (Gm) between the respective values of two samples $Z(\Delta\omega)$ associated with successive frequency offsets and of the subtraction of said largest interval (Gm) from the value of the sample associated with the frequency offset that is greater in absolute values than the one associated with the sample $Z(\Delta\omega)$ the value of which is extrapolated.

5. The method according to claim 1, wherein detecting the samples $Z(\Delta\omega)$ of the first set Z, for which the polarities of the measured values of the theoretical experimental signal are considered to be certain, includes:
- calculating the derivative of a first discrete signal resulting from an ordering of the samples of said first set Z according to increasing frequency offsets;
- detecting any discontinuity of the polarity of said derivative;
- wherein the polarity of the theoretical experimental signal is considered to be certain for the set of the frequency offsets $\Delta\omega$ under consideration, said polarity being inverted when any discontinuity is detected in the polarity of said derivative.

6. The method according to claim 1, further comprising repeating the steps that are necessary for the estimation of the parameters B0 and B1 linked with an elementary volume of the organ, in order to produce a plurality of estimations of said parameters B0 and B1 linked respectively with a plurality of elementary volumes of said organ.

7. The method according to claim 6, further comprising producing an image in the form of a parametric map having pixels which encode respectively the values of the parameter B0 or B1 estimated for elementary volumes of interest.

8. The method according to claim 7, including displaying said image by a human-machine output interface of the imaging analysis system.

9. An imaging analysis system including a processing unit, an interface for communicating with the outside world, and storage media, wherein:
- the communication interface is arranged to receive, from said outside world, experimental data resulting from a WASAB1 acquisition sequence of data produced by spectral sampling of an elementary volume of an organ; and
- the storage media include program instructions, the interpretation of which by said processing unit implements a method according to claim 1.

10. A non-transitory computer-readable medium storing a program including one or more instructions that can be interpreted by a processing unit of an imaging analysis system, wherein the interpretation of said program instructions by said processing unit implements a method according claim 1.

* * * * *